United States Patent
Klein et al.

(10) Patent No.: US 7,417,506 B2
(45) Date of Patent: Aug. 26, 2008

(54) AMPLIFIER HAVING SWITCHABLE NEGATIVE FEEDBACK

(75) Inventors: Horst Klein, Markt Schwaben (DE); Walter Zimmermann, Dorfen (DE)

(73) Assignee: Infineon Technologies AG, Munich (DE)

( * ) Notice: Subject to any disclaimer, the term of this patent is extended or adjusted under 35 U.S.C. 154(b) by 159 days.

(21) Appl. No.: 11/060,062

(22) Filed: Feb. 17, 2005

(65) Prior Publication Data

US 2005/0225390 A1    Oct. 13, 2005

(30) Foreign Application Priority Data

Feb. 17, 2004   (DE) .................. 10 2004 007 635

(51) Int. Cl.
   *H03F 3/45*   (2006.01)
   *H03G 3/12*   (2006.01)

(52) U.S. Cl. ........................... 330/254; 330/282

(58) Field of Classification Search ............... None
   See application file for complete search history.

(56) References Cited

U.S. PATENT DOCUMENTS

| | | | | |
|---|---|---|---|---|
| 3,909,738 A | * | 9/1975 | Niimi | 330/254 |
| 3,952,595 A | * | 4/1976 | Poolman et al. | 374/175 |
| 4,144,578 A | * | 3/1979 | Mueller et al. | 702/199 |
| 4,476,439 A | * | 10/1984 | Sato | 330/254 |
| 4,864,248 A | * | 9/1989 | Jansen | 330/254 |
| 5,384,501 A | * | 1/1995 | Koyama et al. | 327/336 |
| 6,326,842 B1 | | 12/2001 | Kuroda | |
| 6,844,778 B2 | * | 1/2005 | Oppelt | 330/51 |
| 6,892,061 B2 | * | 5/2005 | Asam | 455/313 |
| 7,002,411 B2 | * | 2/2006 | Yeh | 330/252 |
| 7,088,179 B2 | * | 8/2006 | Gilbert et al. | 330/254 |
| 7,109,796 B2 | * | 9/2006 | Heigelmayer et al. | 330/254 |

FOREIGN PATENT DOCUMENTS

| | | |
|---|---|---|
| DE | 196 44 996 A1 | 5/1998 |
| DE | 100 56 517 A1 | 8/2001 |
| EP | 0 840 299 A1 | 5/1998 |

OTHER PUBLICATIONS

First Office Action issued in Chinese Patent Application No. 200510009078.0 received on May 16, 2008 (including English translation).

* cited by examiner

*Primary Examiner*—Robert J. Pascal
*Assistant Examiner*—Krista M Flanagan
(74) *Attorney, Agent, or Firm*—Maginot, Moore & Beck

(57) ABSTRACT

An amplifier having programmable amplification includes a transistor circuit having a plurality of negative feedback resistors, a switch being associated to a negative feedback resistor such that the negative feedback resistors of the transistor circuit can be activated and deactivated selectively by operating switches via a controller. Thus, a broadband amplifier having a high linearity can be implemented.

13 Claims, 6 Drawing Sheets

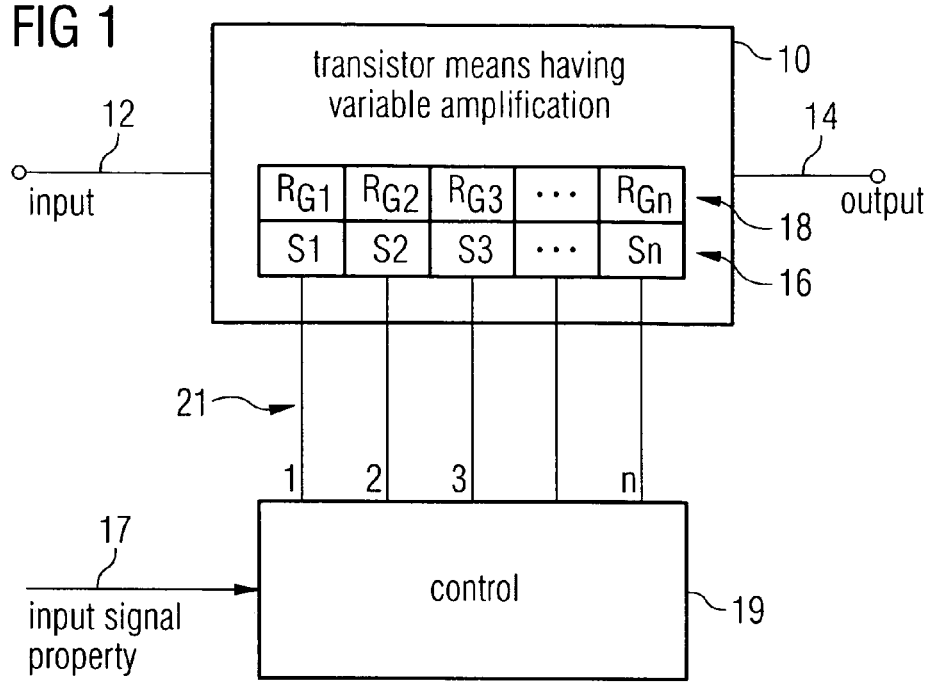
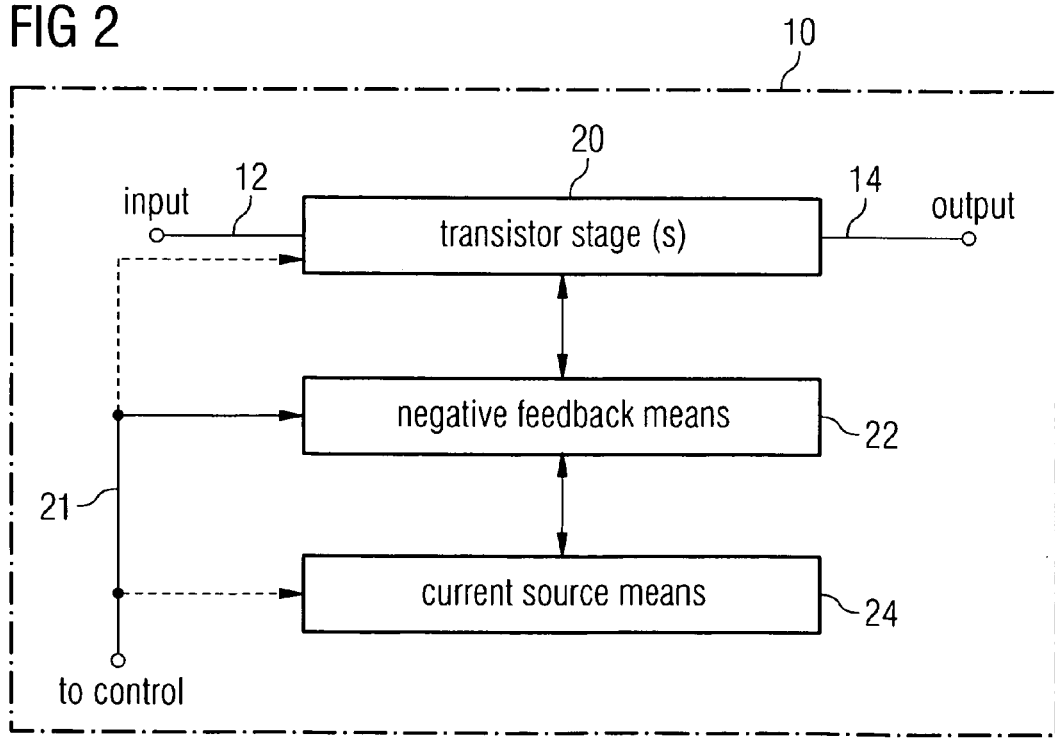

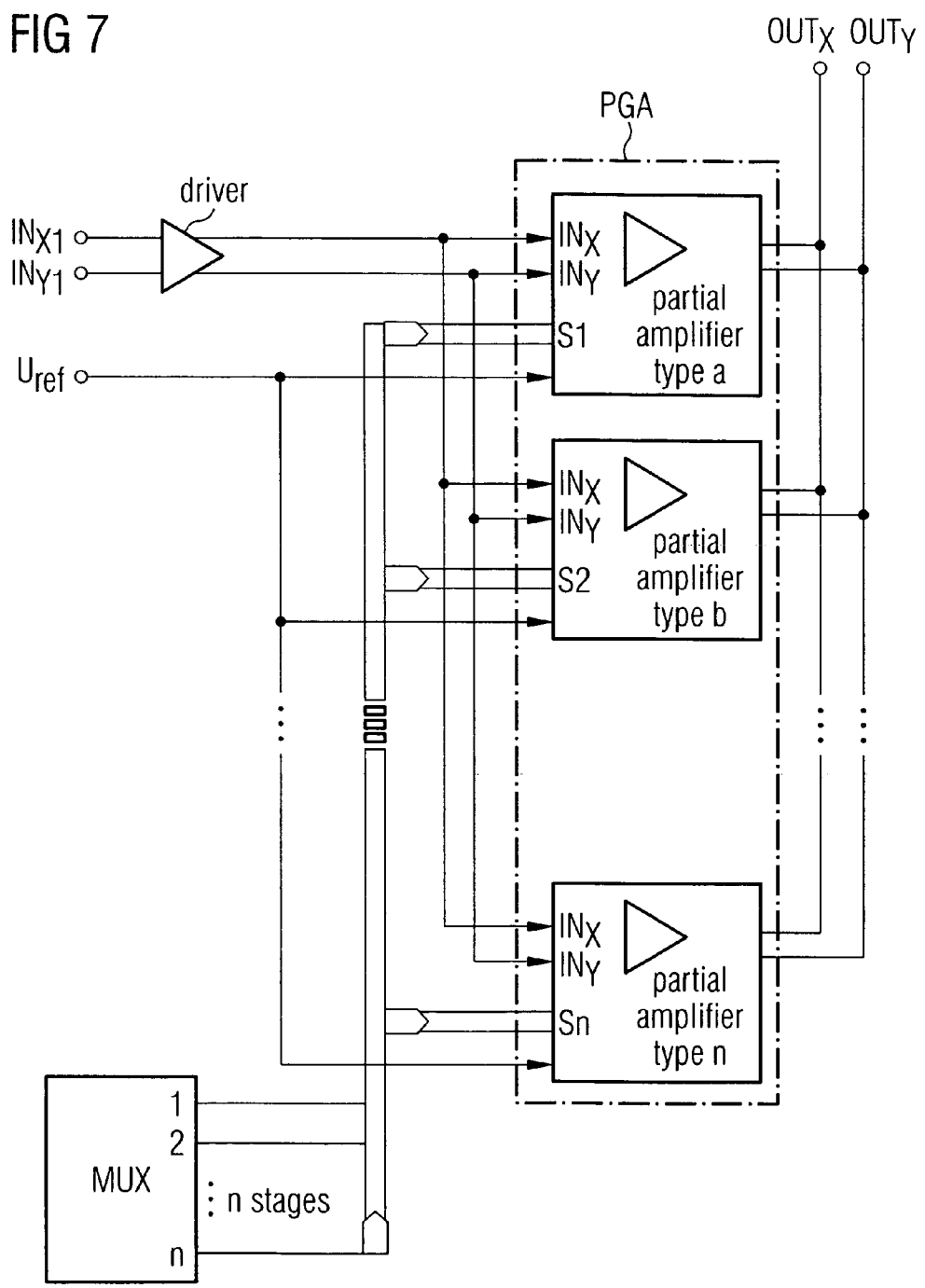

AMPLIFIER HAVING SWITCHABLE NEGATIVE FEEDBACK

CROSS-REFERENCE TO RELATED APPLICATION

This application claims priority from German Patent Application No. 10 2004 007 635.9, which was filed on Feb. 17, 2004, and is incorporated herein by reference in its entirety.

BACKGROUND OF THE INVENTION

1. Field of the Invention

The present invention relates to amplifier circuits and, in particular, to broadband amplifier circuits having high dynamic characteristics and, in particular, to amplifiers having programmable amplification.

2. Description of the Related Art

In many fields of signal processing and, in particular, in the field of video amplifiers, there is demand for an amplifier having a very broad band. Typical requirements for an amplifier in the video field are in a transmission band of 50 to 860 MHz. Additionally, amplifiers of this kind should have a low noise ratio and a high linearity. Put differently, this means that non-linear mixing products of the amplifier remain below a specified threshold value. The so-called third order intermodulation or the so-called "third order intercept point" is a parameter of this.

Furthermore, a mixer is typically downstream of such a broadband amplifier in an input stage of, for example, a television receiver. Mixers most often comprise a certain predetermined input dynamic range. This means that the mixer, on the one hand, requires minimum modulation, i.e. an input signal having a predetermined minimum power, in order for it to operate correctly. Even more important with mixers is the requirement that the input signal into the mixer must not exceed a predetermined maximum power or a predetermined maximum level. If the input signal into the mixer, i.e. the output signal of a broadband amplifier, had too high a level, i.e. if the amplifier amplified to too high an extent, the mixer would be overdriven, which would result in undesired mixing products which may even cause a total failure of the system but would at least severely reduce the signal/noise ratio after the mixer.

Typical solutions for this problem have been to use a broadband amplifier comprising a chain circuit of individual amplifiers, wherein the first amplifier in the chain circuit usually comprises a low noise ratio and has a high amplification, whereas the last amplifier in the chain comprises a small amplification and thus a high noise ratio which, due to the large signal useful level, does not make a real difference.

Thus, the requirement for a minimum level for the mixer is ensured when the overall amplification of the chain circuit having individual amplifiers is set to be sufficiently high.

In order to govern the second problem, i.e. in order to ensure that the mixer is not overdriven, a switchable attenuation member attenuating to a greater or lesser extent depending on the output signal from the amplifier is placed downstream of such an amplifier to obtain the output signal of the entire amplifier/attenuation member assembly at a level which is within the permissible "level corridor" determined by a downstream mixer.

This circuit, however, has several problems. On the one hand, a signal is often amplified in the beginning and subsequently, when the level is too high, attenuated again. The result is a double signal processing of a signal, which is problematic at least as regards the noise introduced, since every signal processing introduces noise into the signal. Furthermore, the chain-connected amplifiers must be designed with care in order to be able to fulfill high linearity requirements.

SUMMARY OF THE INVENTION

It is the object of the present invention to provide an improved amplifier having variable amplification.

In accordance with a first aspect, the present invention provides an amplifier having: transistor means having variable amplification, a plurality of negative feedback resistors and a plurality of switches, the switches being formed such that an associated negative feedback resistor can be activated by operating a switch; and controller means for controlling one or several switches to activate one or several ones of the negative feedback resistors to set a desired amplification.

The present invention is based on the finding that a variable amplification can advantageously be realized by preferably integrated amplifiers having negative feedback characteristics. Where a high amplification is required, the negative feedback resistance is reduced, whereas where a small amplification is required, the negative feedback resistance is increased in order for the amplification of a negative feedback amplifier to decrease. For this, transistor means, such as, for example, a differential amplifier array, includes a plurality of negative feedback resistors, a switch of a plurality of switches being associated to a negative feedback resistor, wherein the amplification of the inventive amplifier is variable by means of the plurality of switches. The switches are controlled by controller means such that one or several ones of the negative feedback resistors are activated to set a desired amplification of the plurality of different amplifications. Activating negative feedback resistors, i.e. putting the negative feedback resistors into operation, so that they influence the amplifier circuit, can take place in different manners depending on the implementation of the amplifier. One way is to connect a plurality of amplifier stages in parallel to different ones of or the same negative feedback resistors and to associate to each individual stage and thus to each negative feedback resistor in an individual stage, a switch which, when operated, has the result that the selected stage of the stages connected in parallel is activated so that the negative feedback resistor in this amplifier stage will influence the performance of the entire amplifier circuit.

In the preferred embodiment of the present invention, only a single transistor stage which, depending on the switch activation, can be connected programmably to one or several selectable negative feedback structures is employed.

In the preferred embodiment of the present invention, a differential amplifier concept is employed in the transistor means, wherein a differential amplifier consists of a transistor stage having load resistors, a coupled negative feedback means and coupled current source means. Depending on the design, the inventive amplifier includes only a single transistor stage and negative feedback means, which can be activated by switches, having negative feedback resistors to each of which a switch is associated.

Depending on the design, an individual current source means is associated to each switchable negative feedback means. If, however, the transistor current required can be the same in all cases, it will be sufficient to use a single current source means and to connect the current source means to the single transistor stage via the plurality of switchable negative feedback means having negative feedback resistors to thus reduce the circuit complexity despite constant circuit parameters, which is of particular advantage in many applications.

The inventive concept is of advantage in that a "double" processing, i.e. at first amplification and subsequent attenuation, is not required. Instead, amplification takes only place to the extent actually required. This can be obtained by the amplifier programmability. Thus, the inventive concept does not suffer, particularly due to noise, by the "double" processing, as has been explained above.

Another advantage of the present invention is that the linearity characteristics of the amplifier become increasingly better with increasing negative feedback resistances. This means that, when the input signals already have a certain level, i.e. when the maximum amplification of the amplifier is not required, to fulfill subsequent signal level requirements, the amplification is inventively reduced, which is how at the same time, i.e. without additional expenditure, the linearity of the amplifier is improved. A high linearity of the amplifier, however, is of high importance in particular with greater input signals.

Another advantage of the present invention is that in particular when the differential amplifier concept is preferably used, good linearity can be maintained even with high amplifications by correspondingly sizing the emitter current defined by the current source means. In particular, symmetrical signal processing resulting in a better second order linearity is specific to the differential amplifier.

Another essential advantage of the inventive design is the characteristic that, with this circuit design, the noise only increases less than proportional to the attenuation. Thus, a gain in S/N (signal/noise ratio) is achieved.

Another advantage of the present invention is that a negative amplification can be implemented easily by correspondingly (greatly) sizing the negative feedback resistors, i.e. a signal attenuation, which is of particular advantage when an input signal already having a level above the specification of a downstream component, such as for example, of a mixer, is obtained.

BRIEF DESCRIPTION OF THE DRAWINGS

Preferred embodiments of the present invention will be detailed subsequently referring to the appended drawings, in which:

FIG. 1 is a block diagram of the inventive amplifier;

FIG. 2 shows a detailed implementation of the transistor means according to a preferred embodiment of the present invention;

FIG. 7 shows another alternative design having amplifiers, connected in parallel, of different types according to the present invention.

DESCRIPTION OF THE PREFERRED EMBODIMENTS

Figure 3:
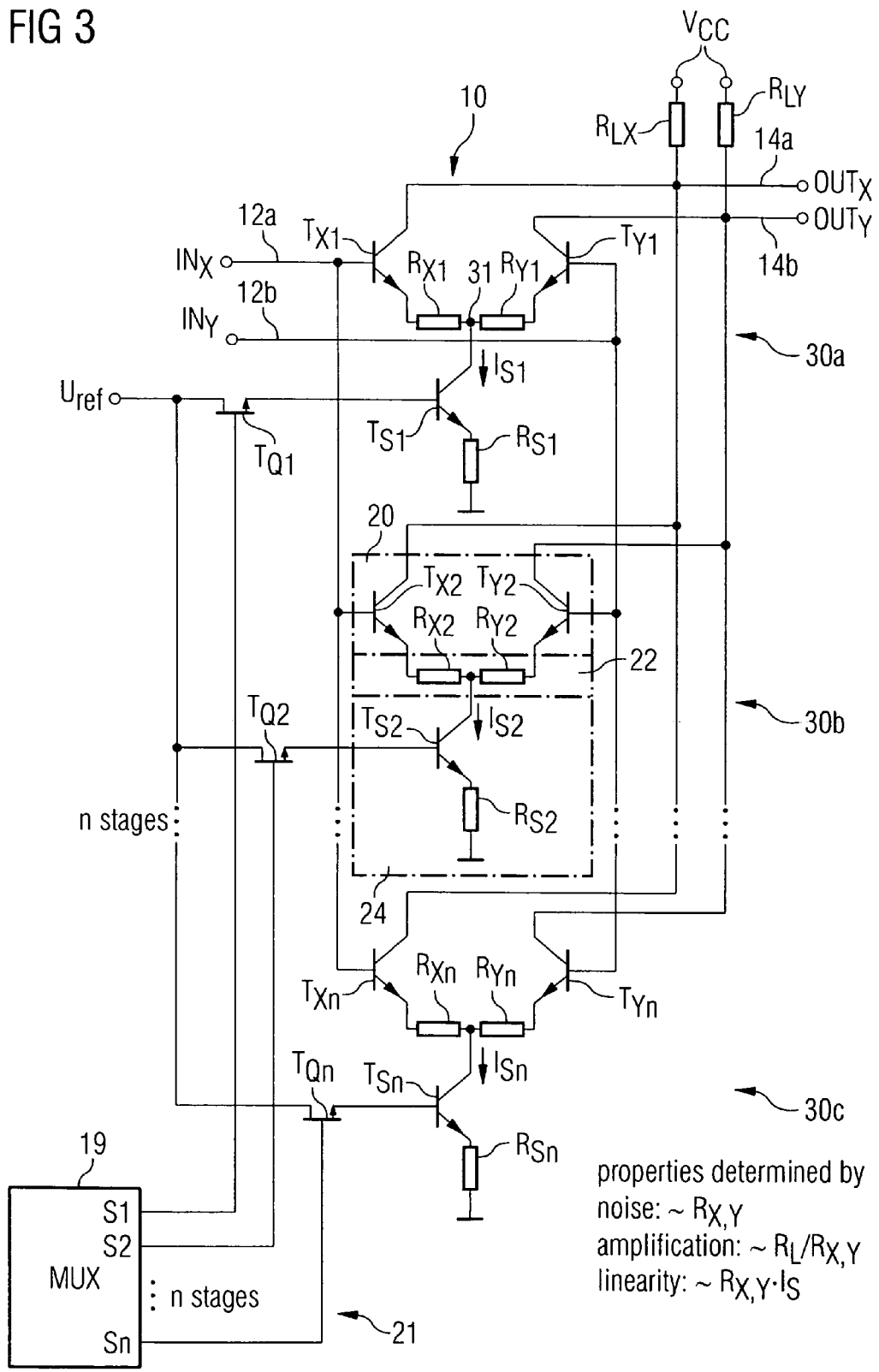
FIG. 3 shows a preferred embodiment of the present invention having differential amplifier stages connected in parallel.

FIG. 1 illustrates an inventive amplifier. The amplifier includes transistor means 10 having a plurality of different amplifications, the transistor means comprising an input 12 for an input signal to be amplified and an output 14 for an amplified output signal. The transistor means additionally includes a plurality of switches S1, S2, S3, . . . , Sn 16, via which the amplification of the transistor means can be varied. Particularly, the transistor means 10, apart from the switches, includes a plurality of negative feedback resistors RG1, RG2, RG3, . . . , RGn 18, wherein a switch of the plurality of switches is associated to a negative feedback resistor, as can be seen referring to FIG. 1 where the negative feedback resistor RG1 is, for example, combined with the switch S1 and where the switch Sn is associated to the negative feedback resistor RGn. It is possible to activate or deactivate, by activating/deactivating the corresponding switch, the negative feedback resistor associated to this switch so that the negative feedback resistor significantly influences the amplification of the transistor means compared to the case where the corresponding negative feedback resistor is not activated.

According to the invention, the effect is made use of that a small amplification but a high linearity can be obtained by a high negative feedback resistor, whereas a comparatively great amplification but also a comparatively reduced linearity can be set by a comparatively low negative feedback resistor.

Thus, an integrated amplifier, which can be switched in amplification, having optimized characteristics as regards noise and linearity can be obtained in order to be able to process a great input level range, as has already been explained.

Subsequently, referring to FIG. 2 the present invention will be explained in greater detail, different embodiments of which will be explained subsequently referring to FIGS. 3 to 7. For the purpose of the following description, the transistor means 10 of FIG. 2 includes a transistor stage 20 coupled to negative feedback means 22 which in turn is coupled to current source means 24. According to the invention, the negative feedback means 22 includes several negative feedback resistors which can be activated by switches, which are controllable via control signals produced by a controller 19 on a control signal line 21. Depending on the design, several transistor stages or current source means may be present, wherein in special embodiments of the present invention different current source means 24 or transistor stages 20 can be activated/deactivated via the control line 21 (as is indicated by the control lines shown in FIG. 2 in broken lines) to fulfill different input signal characteristics which can be fed to the controller 19 via an input signal property (i.e. characteristic line 17 (FIG. 1).

An amplifier having programmable amplification, PGA (PGA=Programmable Gain Amplifier) will be discussed subsequently referring to FIG. 3. The amplifier shown in FIG. 3 includes several amplifier stages 30a, 30b, 30c connected in parallel, wherein each amplifier stage is formed as a differential amplifier stage such that each amplifier stage has a first input 12a, a second input 12b, a first output 14a, and a second output 14b. The differential amplifier stage 30a includes a transistor stage, a negative feedback means and current source means, as has been explained referring to FIG. 2.

The load resistors RLx, RLy or depending on the application, even choke coils and the supply voltage terminal Vcc are associated to the first transistor stage including the two transistors Tx1, Ty1. In this embodiment, all the stages 30a, 30b, 30c, are connected to the same load resistors and the same source Vcc. Depending on the application, different resistors and different supply voltage sources Vcc may also be employed.

The negative feedback means includes a first negative feedback resistor Rx1 and a second negative feedback resistor Ry1 by means of which the transistors of the transistor stage are connected to a common node 31 in which, as is shown in FIG. 3, the operating current from the current source means consisting of the current source transistor Ts1 and the current source resistor Rs1 flows.

A reference voltage is applicable to the current source transistor Ts1 via a switch TQ1. The current Is1 is thus determined by Uref, the base emitter threshold of Ts1 and the resistor Rs1. As is illustrated in the bottom right part of FIG. 3, the linearity of the differential amplifier stage 30a shown in FIG. 3 can be set via the quantity of the current Is1.

The amplification, however, is determined by the ratio of load resistance RL to negative feedback resistance Rx or Ry. The greater the negative feedback resistance, the smaller the amplification and the greater is the linearity.

As regards sizing, it is preferred for the two negative feedback resistances Rx1 and Ry1 or generally the negative feedback resistances Rxi and Ryi to be equal.

The transistor means 10 of FIG. 1 includes, apart from the differential amplifier stage 30a, second, . . . , nth differential amplifier stages and thus n transistor stages, n negative feedback means and n current source means. A switch TQ1, TQ2, . . . , or TQn is associated to each differential amplifier stage and thus each negative feedback means having the corresponding negative feedback resistances to be able to activate the respective stage k and thus the negative feedback resistors Rxk, Ryk of the stage k by means of the switch TQk.

Depending on the implementation, it is preferred to operate in parallel two or more amplifier stages 30a, 30b by correspondingly controlling the switches TQk, wherein in this case the negative feedback resistors in the individual differential amplifier stages could be sized to be identical.

Alternatively, the amplifier shown in FIG. 3 could, however, also be controlled such that only one differential amplifier stage 30a or 30b or 30c will be active at a certain time. In this case, it is preferred to size the negative feedback resistances in the individual stages to be different from one another so that, for example, the first stage 30a has great negative feedback resistances to process signals of a high input level, whereas the differential amplifier stage 30c has smaller negative feedback resistances to be able to process small input signals with a greater amplification and little noise.

The amplifier shown in FIG. 3 is thus formed of several stages which, depending on the requirement, are switched electronically. The individual stages having different amplifications are sized corresponding to their specific requirements, i.e. as regards their negative feedback resistances, the current or the transistor geometries. A low-noise high-amplification stage is used with small input signals. Stages with greater negative feedback having a high linearity at a reduced amplification are employed for increasing input signal levels.

In the design shown in FIG. 3, the programmability of the amplifier is realized by complete stages, which, connected in parallel, are all activated individually. The noise only increases less than proportional to the reduced amplification. The sizing of the individual amplifier cells is simplified by means of the circuit of FIG. 3, the result, however, is a great parasitic load at the input and the output.

It is a disadvantage in this circuit assembly that the parasitic capacitive load by the sum of the transistors Tx1, Ty1 to Txn, Tyn at the input (Inx, Iny) represents a load for the driver and deteriorates the frequency response, the linearity and particularly the third order inter-modulation.

Figure 4:
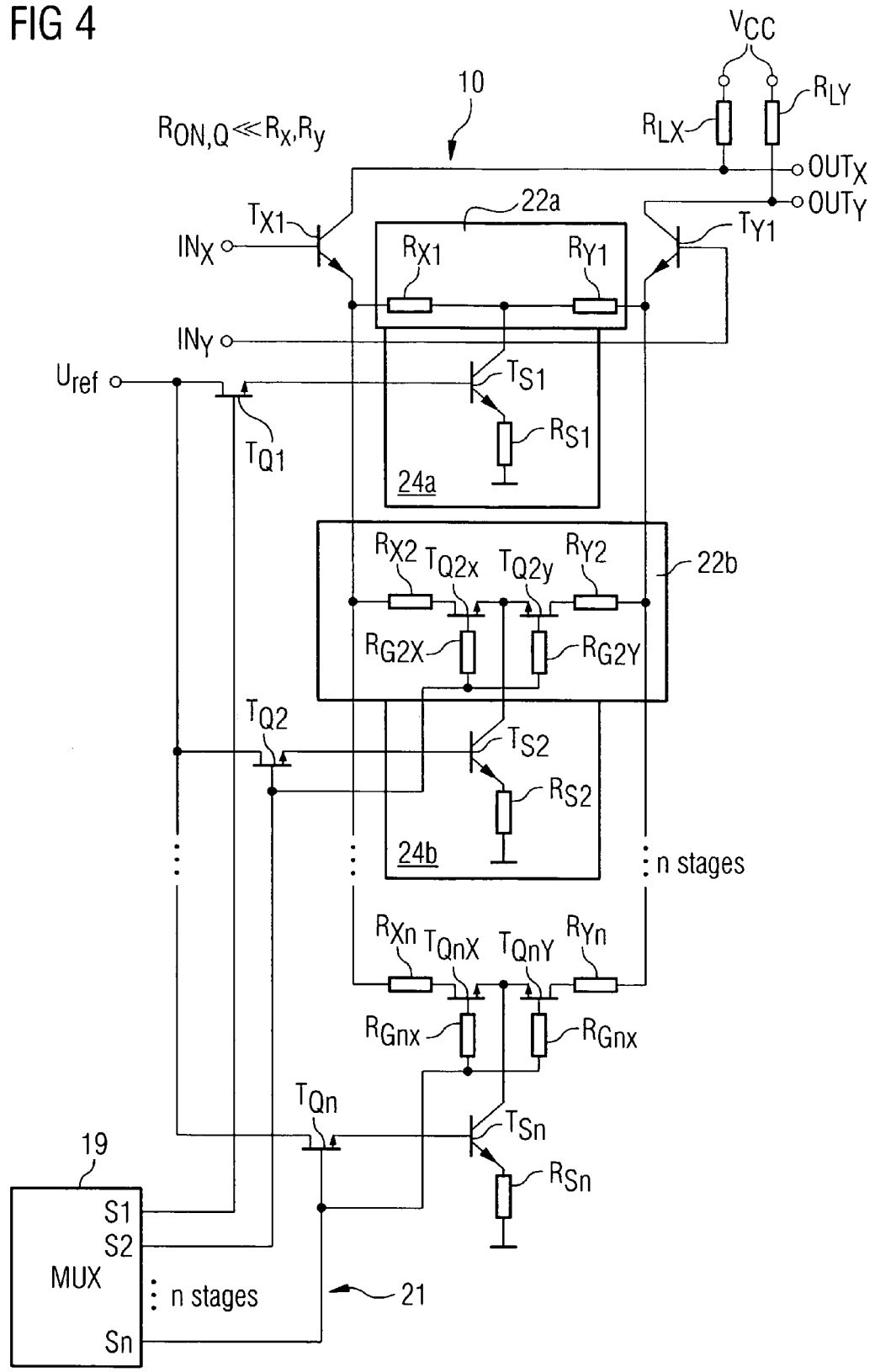
FIG. 4 shows an alternative design having one differential amplifier transistor stage and several negative feedback/current source means which can be activated by switches.

A reduction of the parasitic capacitive load by the large number of resistors in the embodiment shown in FIG. 3 can be achieved in the circuit concept illustrated in FIG. 4. In principle, it is similar to the concept shown in FIG. 3, except for the difference that only a single transistor stage formed by the transistors Tx1, Ty1, is present, whereas a number of n negative feedback means are present, the first negative feedback means being formed by Rx1, Ry1 and the second negative feedback means being formed by Rx2, Ry2, etc.

Additionally, in the embodiment shown in FIG. 4 each negative feedback means k is provided with an individual current source means (24a, 24b) of Tsk and Rsk and a programming switch TQk is associated to each negative feedback resistor.

While the switch TQ1 in the uppermost stage in FIG. 4 is used to switch on or off the current source transistor Ts1, i.e. to activate or deactivate the negative feedback resistors Rx1, Ry1, another pair of switches TQ2x, TQ2y, which are connected together with the switch TQ2 are used, apart from the switch TQ2 connected to the current source transistor, for the activation or deactivation of the negative feedback resistors Rx2, Ry2; the switches Tq2x and Tq2y are controlled via the resistors RG2x and Rg2y to diminish coupling between Tq2x and Tq2y in the "off state". The same applies to all the other stages.

As regards the functionality of the second negative feedback means 22b of FIG. 4, the case will be considered where the switches TQ2x and TQ2y are closed, i.e. have an output resistance only determined by the on resistance of the transistor. If this resistance of the transistor is small, the negative feedback resistors Rx2 and Ry2 will be connected to the current source transistor Ts2 so that these resistors will be activated for a negative feedback of the entire transistor stage 10 when the transistor Ts2 is switched on, which will always be the case when the transistors TQ2 are switched on.

If, however, the transistors TQ2 are open, i.e. if they have a very large output resistance, hardly any current will flow from the voltage source Vcc via the corresponding load resistor, such as, for example, R1x, and the negative feedback resistor Ry to ground so that the corresponding negative feedback resistors in the non-activated negative feedback means 22b will not influence the performance of the amplifier in this case.

The capacitive load is reduced by interconnecting several transistor stages to form a single transistor stage formed by the transistors Tx1, Ty1 having a switchable negative feedback, which directly results in an improved linearity and in an improved frequency response of the entire amplifier.

In the embodiment shown in FIG. 4, it is preferred to operate all the resistors in the high-amplification stage in parallel and to switch off one after the other the negative feedback resistors with the associated switching transistors TQ to reduce the amplification. Furthermore, as has already been explained, gate series resistors for the switches TQ2 are provided to decrease the capacitive coupling of the MOS switching transistors as regards one another, which in turn has a positive effect on the linearities of the individual stages.

Of course, the concept shown in FIG. 3 can be combined with the concept shown in FIG. 4 in that, for example, three complete stages connected in parallel are provided in an amplifier and that a fourth, fifth, . . . (n+3)th stages are provided in an implementation illustrated referring to FIG. 4.

Figure 5:
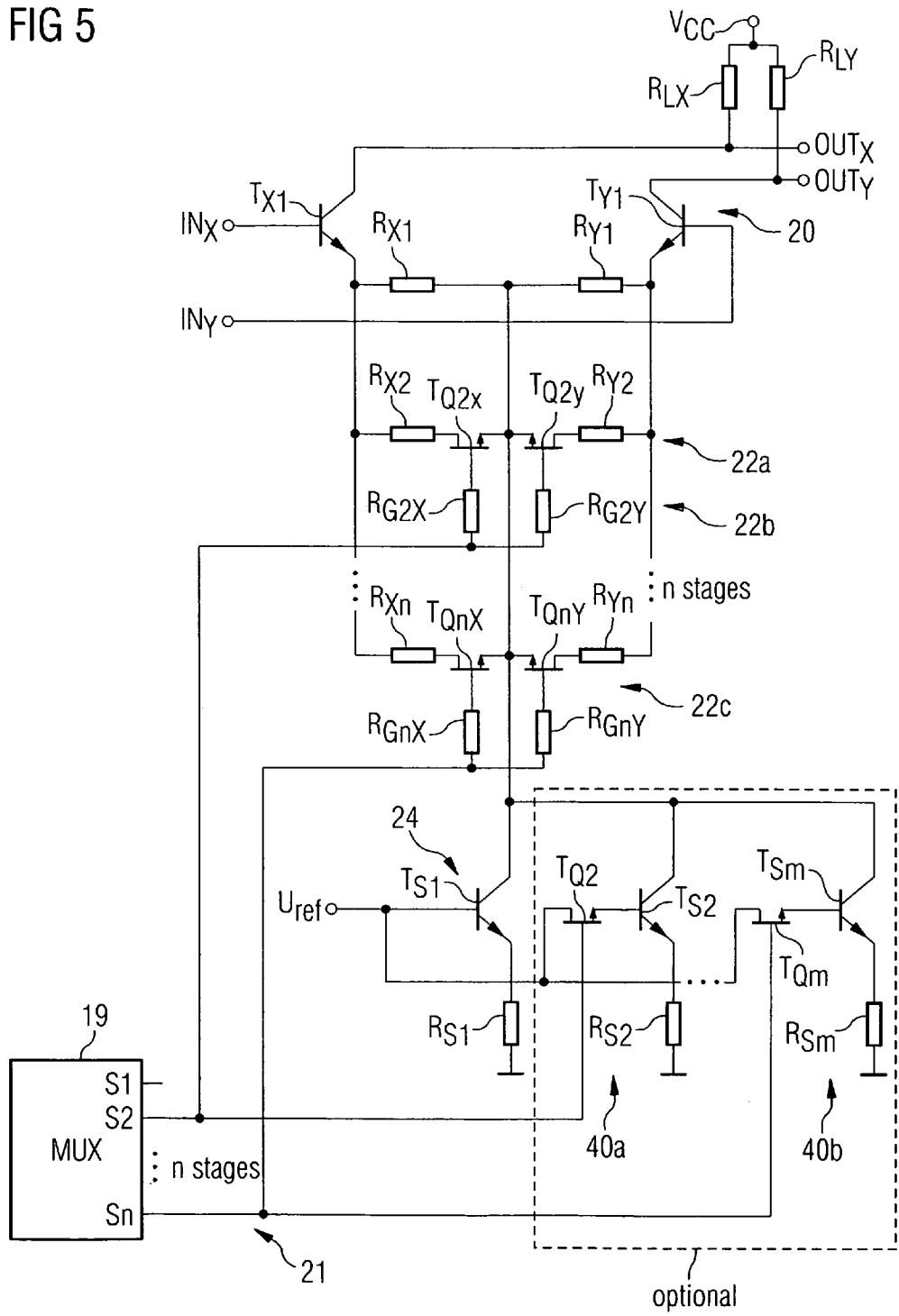
FIG. 5 shows an alternative design having a single transistor stage and a single current source means and several negative feedback resistors which can be activated by switches.

If the requirements to the inventive amplifier are such that all the stages are operated by the same current Is1, the circuit shown in FIG. 4 can be simplified further, as is illustrated in FIG. 5.

In the embodiment shown in FIG. 5, only a single current source means 24, apart from the only transistor stage 20 (formed of the transistors Tx1, Ty1) is present, while a plurality of negative feedback means 22a, 22b, 22c, which can be activated/deactivated individually by respective switches TQ2, TQn are present. As is illustrated in FIG. 5, the only current source means 24, however, can then be connected fixedly to the reference voltage source Uref so that no more switches TQ1, as have been illustrated referring to FIGS. 3 and 4, are required.

Again, the negative feedback resistors Rxi, Ryi are activated/deactivated preferably by MOS field-effect transistors $TQ_{ix}$, $TQ_{iy}$, wherein it is again preferred to control the MOS field-effect transistors via the series resistors $R_{Gix}$, $R_{Giy}$ in order not to have to put up with additional parasitic coupling of the field-effect transistors.

It is preferred in the embodiment shown in FIG. 5 to use further switchable current sources, which are either controlled by the same switching signals as the transistors TQk in order to be able to additionally adjust the linearity characteristics of the amplifier stage to the requirements. The switches $T_{Qk}$ can, however, also be controlled by additionally generated switching signals and thus can be switched on or off separately.

Figure 6:
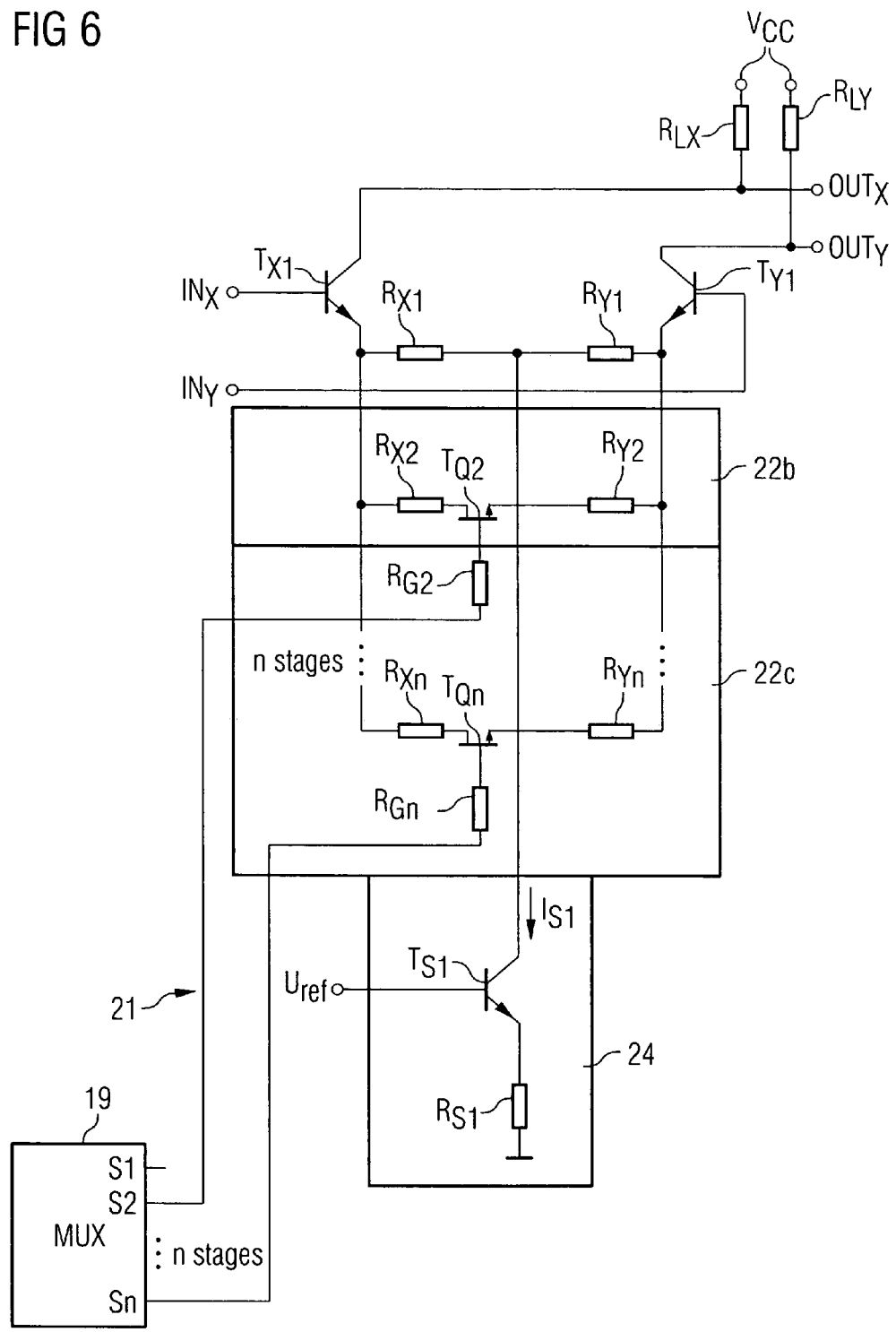
FIG. 6 shows another alternative design having a single current source means, a single transistor stage and different negative feedback means which can be programmed by a reduced number of switches.

In the inventive embodiment shown in FIG. 6 only having one current source feeding Is1 in Rx1 and Ry1, the number of switches in a negative feedback means 22b is reduced compared to the previous embodiment to further decrease parasitic capacities by connecting the two resistors Rx2 and Ry2 to each other via the switch TQ2.

When the switch TQ is open, this series connection behaves exactly as the circuit shown in FIG. 5, the resistors Rx2 and Ry2 are deactivated.

If the switch TQ2, however, is closed by a corresponding signal, for example on the control line 2 (number 21) from the controller 19, the result will be a series connection of the two negative feedback resistors Rx2, Ry2, i.e. an activation of the resistors Rx2, Ry2, so that the effective negative feedback resistor of the circuit is influenced by the resistors Rx2, Ry2 to a greater extent than in the case where the switch TQ2 is open. The result is a changing amplification.

Differing from the embodiment shown in FIG. 5, only one switch per negative feedback means 22b or 22c is required in the embodiment shown in FIG. 6, which again results in an improved linearity of the circuit of FIG. 6 compared to the circuit shown in FIG. 5. Due to this fact and particularly due to the reduced number of components compared to all the other circuits, the circuit concept illustrated in FIG. 6 is preferred.

Thus, the present invention provides an integrated amplifier switchable in amplification in which a broadband amplifier having a high dynamic range which is able to meet sensitive specifications as regards noise ratio and linearity but also as regards a minimum and maximum output power is provided by changing the negative feedback by switching between parallel stages or by interconnecting the emitters and decoupling the switching transistors by gate series resistors.

The essential features of the embodiments of FIGS. 3 to 7 will be summarized briefly below.

Depending on the requirements the inventive PGA (PGA =Programmable Gain Amplifier) can be connected together of different partial amplifier types, wherein the individual partial amplifier types can unite several switching states and can also be operated in a way combined with one another. The amplifier has the following set-up: load resistors at Vcc or optionally via choke, one or several transistor means, one or several negative feedback means and one or several current sources. General advantages are a settable amplification, settable via $R_x$, $R_y$, and $I_s$, and a programmable amplification or attenuation.

The amplifier type according to FIG. 3 consists of individual stages, each of which consisting of at least one transistor pair, a negative feedback unit, and a current source. In particular, a parallel connection of differential amplifier stages which can be activated or deactivated via switches, is shown in FIG. 3. Simple sizing of the negative feedback characteristics and independent sizing of the negative feedback characteristics are advantages of this. A large number of elements and the high parasitic load at the input and the output caused by the large number of transistors connected in parallel and the frequency response are of disadvantage for some applications.

Configuring an entire PGA of such stages according to FIG. 3 provides a flexible circuit but has the disadvantage for some applications that many transistors on the input and on the output side are connected in parallel even if they are not activated via the control line. This causes a great parasitic load at the input and at the output of the entire amplifier and has disadvantageous effects as regards frequency response, noise, and inter-modulation for some applications.

This is why the embodiment of FIG. 4, which is preferred compared to FIG. 3, only has one transistor stage but several switchable negative feedback units. Here there are again two switchable requirements: depending on the controllability required in the respective switching stage, it can be useful to adapt the operating current to the demand to save current. Furthermore, the parasitic load of the negative feedback units should not become too great at the emitters of the amplifying transistors in order not to have negative impacts on the frequency response and intermodulation.

In order to fulfill the requirement of a current minimization with every activated negative feedback unit, the current required for this will also be activated in the partial amplifier circuit according to FIG. 4. This is preferably achieved by a symmetrical arrangement of the negative feedback unit with one switching transistor each for every negative feedback transistor.

Since the switching transistors functionally are in a row, they must be sized to be greater and thus form a greater parasitic load.

FIG. 4 thus shows a parallel connection of different negative feedback means and thus also of negative feedback resistors which can be activated or deactivated by switches, wherein, however, only one transistor stage is formed. The usage of only one transistor stage, the decrease in the number of elements, the smaller parasitic load at the input and the output, full symmetry, having the effect of a good second order inter-modulation, are advantages of this. For a solid design, Ron of the switch $TQ_x$, $TQ_y$ should be considerably smaller than the negative feedback resistance $R_x$, $R_y$ since the parameter matching of $R_X$ to $R_L$ is considerably better than with $R_x$ to $R_{ON,Q}$. Additionally, this allows a constant performance with parameter scattering and temperature response.

When a constant current is required for several switching states, a circuit assembly according to FIG. 5 may be selected, where only one current source is used for all switching states. The switching of the amplification takes place by the switchable negative feedback, wherein additionally different current sources 40a, 40b can be connected to the one current source to increase the operating current in the differential amplifier transistor stage. If the amplifier stages can be operated with one current source only and if the amplification is switched alone by switching the negative feedback resistors, the following advantages will result. The linearity increases in proportion to the amplification reduction, whereas the noise increases less than proportional to the amplification reduction. Additionally, a further reduction of the elements (compared to FIG. 4) is possible.

It is, however, of advantage here to unite the two switching transistors per negative feedback unit to one switching transistor, as is shown in FIG. 6. It can be reduced to a fourth in its effective geometry with an equal operative "on resistance". In the "off stage", the parasitic load for the amplifier transistors decreases considerably. FIG. 6 thus shows a parallel connection of passive negative feedback resistors. This option has all the advantages mentioned before and additionally provides a reduction of parasitic loads by the switches in the negative feedback.

Depending on the overall requirements, a PGA circuit is optimized by optimally combining individual partial amplifier types with one another, as has been illustrated referring to FIG. 7. It is particularly preferred in the circuit concept illustrated in FIG. 7 to connect different types of amplifier stages in parallel. In particular, amplifier stages formed according to FIG. 4 can be connected together with amplifier stages formed according to FIG. 6.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. An amplifier comprising:
 a transistor circuit having variable amplification, the transistor circuit including a plurality of negative feedback resistors and a plurality of switches, the plurality of switches being formed such that an associated negative feedback resistor from the plurality of negative feedback resistors can be activated by operating one of the plurality of switches, the transistor circuit further comprising a single transistor stage and a plurality of negative feedback devices, the plurality of negative feedback devices comprising the plurality of negative feedback resistors, at least one switch of the plurality of switches being associated with each of the plurality of negative feedback devices so that a each of the plurality of negative feedback devices can be activated or deactivated by controlling the associated at least one switch, wherein an input of the transistor stage forms an input of the transistor circuit and an output of the transistor stage forms an output of the transistor circuit, and wherein at least one of the plurality of negative feedback devices comprises a first negative feedback resistor, a first switch, a common node, a second switch, and a second negative feedback resistor, the first and second negative feedback resistors being coupled to the common node via the first and second switches; and
 a controller operable to control at least one of the plurality of switches and to activate at least one of the plurality of negative feedback resistors to set a desired amplification.

2. An amplifier comprising:
 a transistor circuit having variable amplification, the transistor circuit including a plurality of negative feedback resistors and a plurality of switches, the plurality of switches being formed such that an associated negative feedback resistor from the plurality of negative feedback resistors can be activated by operating one of the plurality of switches, the transistor circuit further comprising a single transistor stage and a plurality of negative feedback devices, the plurality of negative feedback devices comprising the plurality of negative feedback resistors, at least one switch of the plurality of switches being associated with each of the plurality of negative feedback devices so that a each of the plurality of negative feedback devices can be activated or deactivated by controlling the associated at least one switch, wherein an input of the transistor stage forms an input of the transistor circuit and an output of the transistor stage forms an output of the transistor circuit, and wherein at least one of the plurality of negative feedback device devices comprises a first negative feedback resistor and a second negative feedback resistor operable to be connected in series via a connection switch; and
 a controller operable to control at least one of the plurality of switches and to activate at least one of the plurality of negative feedback resistors to set a desired amplification.

3. An amplifier comprising:
 a transistor circuit having variable amplification, the transistor circuit including a plurality of negative feedback resistors and a plurality of switches, the plurality of switches being formed such that an associated negative feedback resistor from the plurality of negative feedback resistors can be activated by operating one of the plurality of switches, the transistor circuit further comprising a single transistor stage and a plurality of negative feedback devices, the plurality of negative feedback devices comprising the plurality of negative feedback resistors, at least one switch of the plurality of switches being associated with each of the plurality of negative feedback devices so that a each of the plurality of negative feedback devices can be activated or deactivated by controlling the associated at least one switch, wherein an input of the transistor stage forms an input of the transistor circuit and an output of the transistor stage forms an output of the transistor circuit, and wherein a controller terminal of the associated at least one switch connected to a negative feedback resistor is connected to the controller via a series resistor; and
 a controller operable to control at least one of the plurality of switches and to activate at least one of the plurality of negative feedback resistors to set a desired amplification.

4. An amplifier comprising:
 at least one transistor stage comprising a plurality of transistors;
 a plurality of negative feedback means connected to the at least one transistor stage, the plurality of negative feedback means connecting the plurality of transistors to at least one common node, wherein each of the plurality of negative feedback means comprise a plurality of negative feedback resistors and at least one associated switch, wherein operation of the at least one switch activates the associated plurality of negative feedback resistors;
 at least one current source means connected to the plurality of negative feedback means; and
 a controller operable to control the current source means and operable to activate at least one of the plurality of negative feedback means to set a desired amplification.

5. The amplifier of claim 4 further comprising a supply voltage terminal coupled to the plurality of transistors in the at least one transistor stage.

6. The amplifier of claim 4 further comprising a plurality of controller switches positioned between a reference voltage terminal and the at least one current source means, wherein the controller is operable to selectively activate the plurality of controller switches and control the at least one current source means.

7. An amplifier comprising:
a transistor circuit having variable amplification, the transistor circuit including a plurality of negative feedback resistors and a plurality of switches, the plurality of switches being formed such that an associated negative feedback resistor from the plurality of negative feedback resistors can be activated by operating one of the plurality of switches, the transistor circuit further comprising a differential amplifier stage, the differential amplifier stage comprising a first transistor, a second transistor, first negative feedback resistor, a second negative feedback resistor, a common node and a current source, wherein the first transistor is connected to the common node via the first negative feedback resistor, the second transistor is connected to the common node via the second negative feedback resistor, and the current source is connected between the common node and a reference potential, wherein the current source comprises a current source transistor and a current source resistor between the current source transistor and the reference potential, and wherein a reference voltage is applicable to the controller terminal of the current source transistor; and
a controller operable to control at least one of the plurality of switches and to activate at least one of the plurality of negative feedback resistors to set a desired amplification.

8. An amplifier comprising:
a transistor circuit having variable amplification, the transistor circuit including a plurality of negative feedback resistors and a plurality of switches, the plurality of switches being formed such that an associated negative feedback resistor from the plurality of negative feedback resistors can be activated by operating one of the plurality of switches, the transistor circuit further comprising a plurality of amplifier stages, each amplifier stage comprising an input terminal, at least one of the plurality of negative feedback resistors and an output terminal, wherein the input terminals of the plurality of amplifier stages are connected to one another and form an input of the transistor circuit, wherein the output terminals of the plurality of amplifier stages are connected to one another and form an output of the transistor circuit, and wherein each amplifier stage can be activated or deactivated by one of the plurality of switches; and
a controller operable to control at least one of the plurality of switches and to activate at least one of the plurality of negative feedback resistors to set a desired amplification.

9. The amplifier according to claim 8, wherein the plurality of amplifier stages are sized to be different so that they differ in at least one aspect selected from a group consisting of a transistor geometry, a negative feedback resistor, an operating current, a noise ratio, an amplification and a linearity.

10. An amplifier comprising:
a transistor circuit having variable amplification, the transistor circuit including a plurality of negative feedback resistors and a plurality of switches, the plurality of switches being formed such that an associated negative feedback resistor from the plurality of negative feedback resistors can be activated by operating one of the plurality of switches, the transistor circuit further comprising a single transistor stage and a plurality of negative feedback devices, the plurality of negative feedback devices comprising the plurality of negative feedback resistors, at least one switch of the plurality of switches being associated with each of the plurality of negative feedback devices so that a each of the plurality of negative feedback devices can be activated or deactivated by controlling the associated at least one switch, wherein an input of the transistor stage forms an input of the transistor circuit and an output of the transistor stage forms an output of the transistor circuit, wherein the transistor stage is a differential amplifier transistor stage, and wherein each of the plurality of negative feedback devices comprise a first negative feedback resistor and a second negative feedback resistor, a common node, a first switch and a second switch, wherein the first negative feedback resistor is connected to the common node via the first switch and the second negative feedback resistor is connected to the common node via the second switch; and
a controller operable to control at least one of the plurality of switches and to activate at least one of the plurality of negative feedback resistors to set a desired amplification.

11. The amplifier according to claim 10, wherein each of the plurality of negative feedback devices is associated with an individual current source comprising a transistor the controller terminal of which is coupled to a control switch so such that the controller is operable for each of the plurality of negative feedback devices to both activate the associated individual current source and connect the negative feedback resistors to the common node by closing the control switch.

12. The amplifier according to claim 10, wherein the plurality of negative feedback devices are all associated to a common current source, the controller operable to activate the negative feedback resistors of only one of the plurality of negative feedback devices by controlling the switches or to connect in parallel the negative feedback resistors of at least two of the plurality of negative feedback devices.

13. An amplifier comprising:
a transistor circuit having variable amplification, the transistor circuit including a plurality of negative feedback resistors and a plurality of switches, the plurality of switches being formed such that an associated negative feedback resistor from the plurality of negative feedback resistors can be activated by operating one of the plurality of switches, the plurality of switches sized such that a resistance of each switch in the activated stage of the switch is smaller than or equal to a negative feedback resistance associated to the switch; and
a controller operable to control at least one of the plurality of switches and
to activate at least one of the plurality of negative feedback resistors to set a desired amplification.

* * * * *